(12) United States Patent
Shi et al.

(10) Patent No.: US 11,867,758 B2
(45) Date of Patent: *Jan. 9, 2024

(54) TEST METHOD FOR CONTROL CHIP AND RELATED DEVICE

(71) Applicant: CHANGXIN MEMORY TECHNOLOGIES, INC., Hefei (CN)

(72) Inventors: Chuanqi Shi, Hefei (CN); Heng-Chia Chang, Hefei (CN); Li Ding, Hefei (CN); Jie Liu, Hefei (CN); Jun He, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 126 days.

This patent is subject to a terminal disclaimer.

(21) Appl. No.: 17/595,452

(22) PCT Filed: Oct. 15, 2020

(86) PCT No.: PCT/CN2020/121294
§ 371 (c)(1),
(2) Date: Nov. 17, 2021

(87) PCT Pub. No.: WO2021/179601
PCT Pub. Date: Sep. 16, 2021

(65) Prior Publication Data
US 2022/0214397 A1    Jul. 7, 2022

(30) Foreign Application Priority Data
Mar. 11, 2020 (CN) .......................... 202010166586.4

(51) Int. Cl.
*G01R 31/3177* (2006.01)
*G01R 31/317* (2006.01)
(Continued)

(52) U.S. Cl.
CPC ...... *G01R 31/3177* (2013.01); *G01R 31/2834* (2013.01); *G01R 31/2856* (2013.01);
(Continued)

(58) Field of Classification Search
CPC ............ G01R 31/2856; G01R 31/2834; G01R 31/31917; G01R 31/3193;
(Continued)

(56) References Cited

U.S. PATENT DOCUMENTS 9,058,897 B2   6/2015   Yu
10,114,693 B2  10/2018  Kim
(Continued)

FOREIGN PATENT DOCUMENTS

CN          1551225 A      12/2004
CN          1627516 A       6/2005
(Continued)

OTHER PUBLICATIONS

Supplementary European Search Report cited in EP20923997.9, dated Apr. 25, 2022, 8 pages.
(Continued)

*Primary Examiner* — April Y Blair
*Assistant Examiner* — Sazzad Hossain
(74) *Attorney, Agent, or Firm* — Cooper Legal Group, LLC

(57) ABSTRACT

Embodiments of the present disclosure provide a test method and apparatus for a control chip, and an electronic device, which relate to the field of semiconductor device test technologies. The control chip includes a built-in self-test BIST circuit. The method is performed by the BIST circuit. The method includes: reading first test vectors stored in a first target memory chip; sending the first test vectors to the control chip; receiving first output information returned by the control chip in response to the first test vectors; and
(Continued)

acquiring a first test result of the control chip based on the first output information and the first test vectors corresponding to the first output information. By means of the technical solutions provided in the embodiments of the present disclosure, so that a storage space for test vectors can be enlarged, and the test efficiency can be increased.

16 Claims, 12 Drawing Sheets

(51) Int. Cl.
    *G01R 31/3193*      (2006.01)
    *G01R 31/319*      (2006.01)
    *G11C 29/56*      (2006.01)
    *G01R 31/28*      (2006.01)
    *G01R 31/3187*      (2006.01)
    *G01R 31/3185*      (2006.01)

(52) U.S. Cl.
    CPC ...... *G01R 31/3187* (2013.01); *G01R 31/3193* (2013.01); *G01R 31/31713* (2013.01); *G01R 31/31724* (2013.01); *G01R 31/31917* (2013.01); *G01R 31/31932* (2013.01); *G01R 31/318566* (2013.01); *G11C 29/56* (2013.01); *G11C 2029/5602* (2013.01)

(58) Field of Classification Search
    CPC ........ G01R 31/31713; G01R 31/31724; G01R 31/3187; G01R 31/31932; G01R 31/318566; G01R 31/31919; G01R 31/3177; G11C 29/56; G11C 2029/5602
    See application file for complete search history.

(56) References Cited

U.S. PATENT DOCUMENTS

| | | | |
|---|---|---|---|
| 2002/0073374 A1 | 6/2002 | Danialy | |
| 2005/0229062 A1* | 10/2005 | Volkerink | G01R 31/31921 714/738 |
| 2008/0195901 A1 | 8/2008 | Solt et al. | |
| 2012/0124441 A1* | 5/2012 | Teng | G11C 29/16 714/735 |
| 2013/0170274 A1 | 7/2013 | Yu | |
| 2015/0293173 A1* | 10/2015 | Tsuboi | G01R 31/3177 714/727 |
| 2015/0316605 A1 | 11/2015 | Deutsch et al. | |
| 2018/0095128 A1 | 4/2018 | Deutsch et al. | |
| 2018/0095129 A1 | 4/2018 | Deutsch et al. | |
| 2018/0096979 A1 | 4/2018 | Pappu et al. | |
| 2018/0210786 A1 | 7/2018 | Kim | |
| 2019/0051370 A1 | 2/2019 | Azam | |
| 2020/0241070 A1* | 7/2020 | Kishore | G01R 31/31907 |
| 2022/0214397 A1 | 7/2022 | Shi | |
| 2022/0223219 A1* | 7/2022 | Shi | G01R 31/28 |

FOREIGN PATENT DOCUMENTS

| | | |
|---|---|---|
| CN | 1979690 A | 6/2007 |
| CN | 101587754 A | 11/2009 |
| CN | 102103643 A | 6/2011 |
| CN | 102183726 A | 9/2011 |
| CN | 102385560 A | 3/2012 |
| CN | 103187092 A | 7/2013 |
| CN | 104205233 A | 12/2014 |
| CN | 104316866 A | 1/2015 |
| CN | 104505126 A | 4/2015 |
| CN | 106205738 A | 12/2016 |
| CN | 207541950 U | 6/2018 |
| CN | 108732487 A | 11/2018 |
| CN | 110120242 A | 8/2019 |
| CN | 110289041 A | 9/2019 |
| JP | H1040700 A | 2/1998 |

OTHER PUBLICATIONS

Written Opinion as cited in PCT/CN2020/121294, dated Jan. 15, 2021, 6 pages.
International Search Report as cited in PCT Application No. PCT/CN2020/121294 dated Jan. 15, 2021, 10 pages.
International Search Report in the international application No. PCT/CN2020/121299, dated Jan. 8, 2021. 3 pages.
English translation of the Written Opinion of the International Search Authority in the international application No. PCT/CN2020/121299, dated Jan. 8, 2021. 3 pages.
First Office Action of the Chinese application No. 202010167247.8, dated Feb. 14, 2022. 15 pages with English translation.
Second Office Action of the Chinese application No. 202010167247.8, dated Aug. 3, 2022. 14 pages with English translation.
First Office Action of the U.S. Appl. No. 17/595,456, dated Jun. 8, 2023. 60 pages.
First Office Action of the Chinese application No. 202010166586.4, dated Feb. 22, 2022. 21 pages with English translation.
Second Office Action of the Chinese application No. 202010166586.4, dated Aug. 2, 2022. 18 pages with English translation.

\* cited by examiner

TEST METHOD FOR CONTROL CHIP AND RELATED DEVICE

CROSS-REFERENCE TO RELATED APPLICATIONS

This application claims priority to and benefits of Chinese Patent Application No. 202010166586.4, entitled "TEST METHOD FOR CONTROL CHIP AND RELATED DEVICE", filed on Mar. 11, 2020, the entire content of which is incorporated herein by reference.

TECHNICAL FIELD

The present disclosure relates to the field of semiconductor device test technology, and specifically, to a test method for a control chip and a related device.

BACKGROUND

As process sizes of semiconductors keep decreasing, the scale of integrated circuit (IC) design becomes increasingly large. Highly complex IC products are facing growing challenges such as high reliability, high quality, low costs, and short time to market. In one aspect, as process sizes of semiconductors decrease, memories are prone to more types of defects. In another aspect, as the complexity of IC products increases, more and more memories such as random-access memories (RAMs) are used in IC products.

A control chip (for example, a base die/logic die, or the like) in a storage device (for example, a dynamic random-access memory (DRAM)) includes a large number of circuits used for implementing various control logics, for example, digital circuits such as an AND gate, a NAND gate, a NOT gate and an XOR gate, and other analog circuits. Therefore, to test whether the control chip can correctly perform these control logics, a large number of test vectors are required.

FIG. 1 is a schematic diagram of testing a control chip in a DRAM in the related art. As shown in FIG. 1, a storage device that includes four DRAM chips (DRAM chips 0 to 3) stacked on a control chip is used as an example herein. The four DRAM chips are electrically connected by through silicon vias (TSVs). In the related art, automatic test equipment (ATE) is used to test a control chip of a storage device. Before the ATE tests the control chip, a large number of test vectors required for testing the control chip need to be stored in an internal memory space of an ATE tester (that is, the memory of the tester). Because the memory of the tester is limited, all test vectors required for testing the control chip cannot be loaded to the tester once. As a result, in a test process, it is inconvenient to read test vectors, and test vectors need to be stored and read for multiple times, leading to longer test time, lower test efficiency, and higher test costs.

Next, the degree of dependence on ATE is relatively high in the related art. As the operating frequency, data bit width, and the like of a storage device increase, ATE becomes increasingly expensive. If ATE is directly used to test a control chip, the costs are relatively high. When the ATE is used to test the control chip, the ATE needs to use direct access (DA) pads on the control chip to send test vectors to the control chip and use the DA pads to read, from the control chip, output data returned by the control chip in response to the test vectors. There are usually a relatively small number of DA pads. As the number of the DA pads increases, the costs of probe cards are increased. Therefore, limited by peripheral pins of the storage device, the test efficiency of the control chip is reduced, and test costs are higher.

It needs to be noted that the information disclosed in the foregoing Background part is only used for better understanding of the background of the present disclosure, and therefore may include information that does not constitute the prior art known to a person of ordinary skill in the art.

SUMMARY

An objective of the present disclosure is to provide a test method for a control chip and a related device to overcome the foregoing deficiencies the prior art, such as the technical problems in the related art that an ATE tester has limited memory space and cannot store once a large number of test vectors used for testing a control chip and at the same time the degree of dependence on ATE is relatively high.

An embodiment of the present disclosure provides a test method for a control chip. The control chip includes a built-in self-test (BIST) circuit. The test method is performed by the BIST circuit. The method includes: reading first test vectors stored in a first target memory chip; sending the first test vectors to the control chip; receiving first output information returned by the control chip in response to the first test vectors; and acquiring a first test result of the control chip based on the first output information and the first test vectors corresponding to the first output information.

In some exemplary embodiments of the present disclosure, the method further includes: reading second test vectors stored in ATE; sending the second test vectors to the control chip; receiving second output information returned by the control chip in response to the second test vectors; and acquiring a second test result of the control chip based on the second output information and the second test vectors corresponding to the second output information.

In some exemplary embodiments of the present disclosure, the method further includes: sending the first test result of the control chip to a second target memory chip for storage.

In some exemplary embodiments of the present disclosure, the control chip, the first target memory chip, and the second target memory chip belong to the same storage device.

In some exemplary embodiments of the present disclosure, the first target memory chip and the second target memory chip are vertically stacked in sequence on or under the control chip.

In some exemplary embodiments of the present disclosure, the method further includes: receiving a first control instruction sent by ATE; reading the first test result of the control chip from the second target memory chip in response to the first control instruction; and sending the first test result of the control chip to the ATE.

In some exemplary embodiments of the present disclosure, the method further includes: sending the first test result of the control chip to an automatic storage device for storage.

In some exemplary embodiments of the present disclosure, the method further includes: receiving a second control instruction sent by ATE; and storing, in response to the second control instruction, at least some of test vectors used for testing the control chip as the first test vectors in the first target memory chip.

In some exemplary embodiments of the present disclosure, the method further includes: receiving a third control instruction sent by ATE; testing the first target memory chip in response to the third control instruction; and repairing the first target memory chip if the first target memory chip fails the test.

In some exemplary embodiments of the present disclosure, the method further includes: acquiring a current status of a memory chip in a storage device; and using the memory chip in an idle state as the first target memory chip if the current status of the memory chip is the idle state, to store at least some of test vectors used for testing the control chip as the first test vectors in the first target memory chip.

In some exemplary embodiments of the present disclosure, the method further includes: receiving a test instruction sent by ATE; and testing a function of the BIST circuit in response to the test instruction.

In some exemplary embodiments of the present disclosure, the method further includes: receiving an initialization instruction sent by ATE; and initializing the BIST circuit in response to the initialization instruction.

In some exemplary embodiments of the present disclosure, the first target memory chip includes a plurality of memory chips, and the plurality of memory chips are vertically stacked in sequence on or under the control chip.

In some exemplary embodiments of the present disclosure, the first test vector includes any one of a scan test vector and a function test vector.

An embodiment of the present disclosure provides a test apparatus for a control chip. The control chip includes a BIST circuit. The BIST circuit includes the test apparatus. The apparatus includes: a first test vector reading unit, configured to read first test vectors stored in a first target memory chip; a first test vector sending unit, configured to send the first test vectors to the control chip; a first output information receiving unit, configured to receive first output information returned by the control chip in response to the first test vectors; and a first test result acquiring unit, configured to acquire a first test result of the control chip based on the first output information and the first test vectors corresponding to the first output information.

An embodiment of the present disclosure provides an electronic device, including: one or more processors; and a storage apparatus, configured to store one or more programs, where the one or more programs, when performed by the one or more processors, cause the one or more processors to implement the method in the foregoing embodiments.

An embodiment of the present disclosure provides a computer-readable storage medium, storing a computer program, where the program is executed by a processor to implement the method in the foregoing embodiments.

For the test method and apparatus for a control chip, the electronic device, and the computer-readable storage medium provided in some embodiments of the present disclosure, in one aspect, a BIST circuit in the control chip is used to implement the test of the control chip, so that the degree of dependence on ATE can be reduced, and test costs are reduced. In another aspect, a first target memory chip other than the ATE can be used for storing first test vectors used for testing the control chip, so that a storage space for test vectors can be enlarged, thereby implementing that a large number of test vectors used for testing the control chip are all loaded once. In this way, during the test of the control chip, the test speed of the control chip can be increased, the test efficiency can be increased, and the test costs can be reduced.

It should be understood that the foregoing general description and the following detailed description are only exemplary and explanatory, and cannot limit the present disclosure.

BRIEF DESCRIPTION OF THE DRAWINGS

The accompanying drawings are incorporated in the specification and constitute a part of the specification, show embodiments conforming to the present disclosure, and are used together with the specification to explain the principle of the present disclosure. Apparently, the accompanying drawings in the following description show only some embodiments of the present disclosure, and a person of ordinary skill in the art may still derive other drawings from these accompanying drawings without creative efforts.

DETAILED DESCRIPTION

Figure 1:
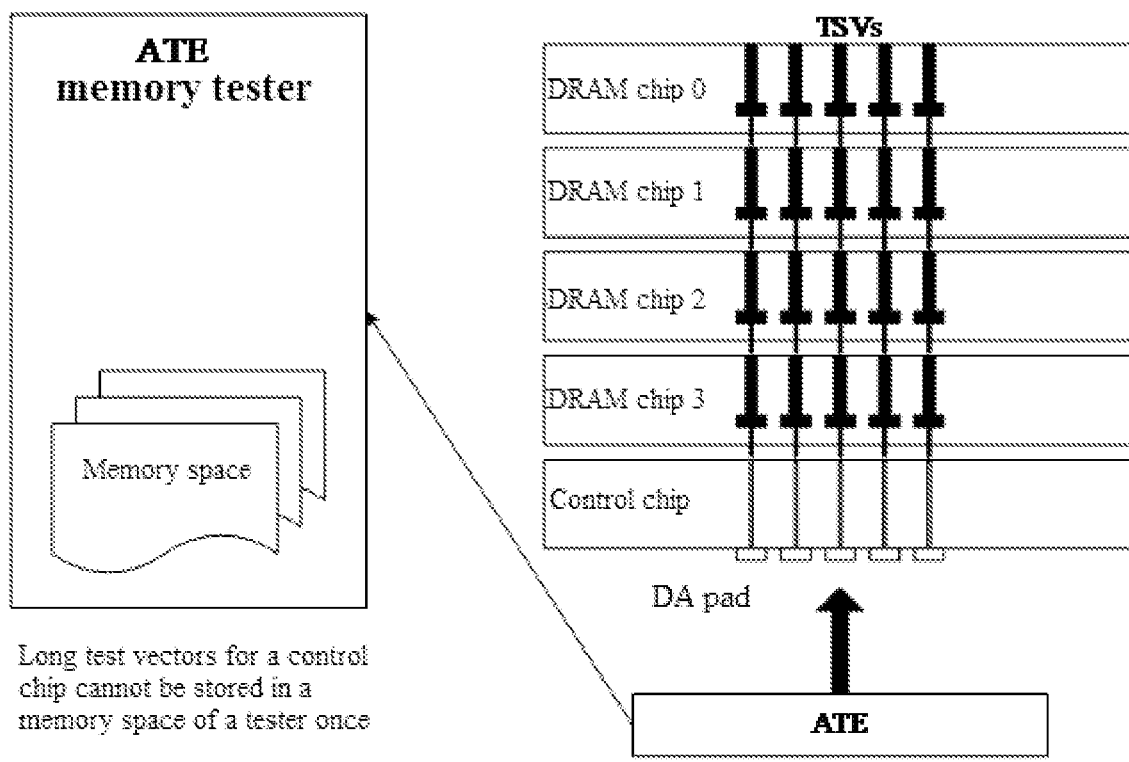
FIG. 1 is a schematic diagram of testing a control chip in a DRAM in the related art.

Now exemplary embodiments will be described more fully with reference to the accompanying drawings. However, the exemplary embodiments can be implemented in various ways and shall not be construed as limited to the embodiments set forth herein; rather, these embodiments are provided to make the present disclosure full and complete, and fully convey the concept of the exemplary embodiments to those skilled in the art. Like reference numerals through the drawings denote the same or similar structures, and thus their detailed description will be omitted. In addition, the figures are only used for schematic illustration but are not necessarily drawn to scale.

Although relative terms such as "upper" and "lower" are used in the specification to describe the relative relationship of one component with respect to another component as shown in the figures, these terms are used in this specification only for convenience, for example, based on the exemplary directions shown in the figures. It is to be understood that if an apparatus shown in the figures is turned upside down, the described "upper" component will become a "lower" component. When a structure is "on" another structure, it may mean that the structure is integrally formed on the another structure, or that the structure is "directly" provided on the another structure, or that the structure is "indirectly" provided on the another structure via still another structure.

The terms "a", "an", "the", "said", and "at least one" are used to indicate the presence of one or more elements/components etc. The terms "include" and "have" are used to indicate the meaning including an opening inclusion and indicate that there may be other elements/components etc. in addition to the listed elements/components etc. The terms "first" and "second" are only used as reference only, not as a restriction on the number of their subjects.

Figure 2:
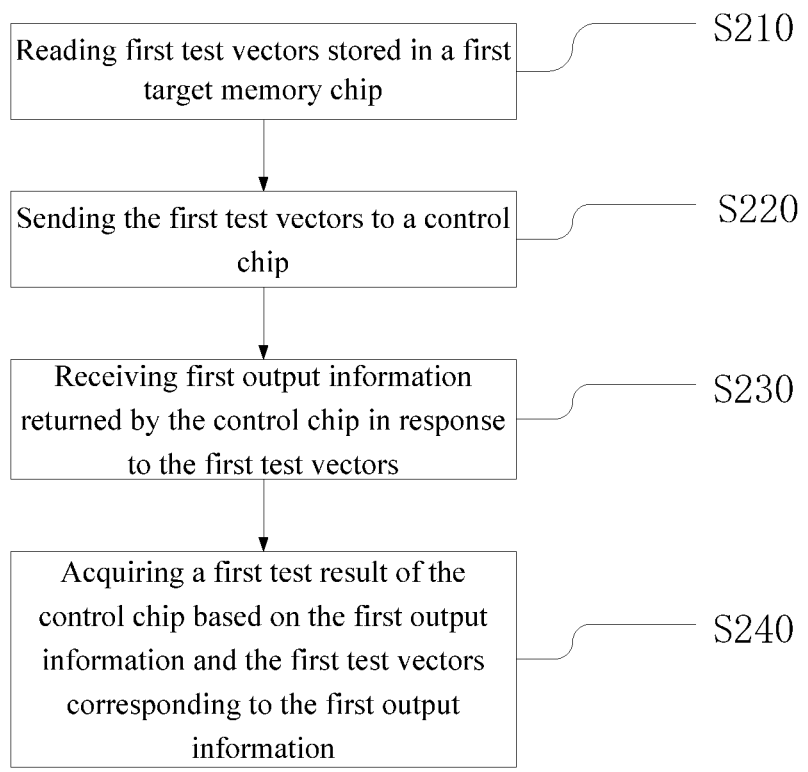
FIG. 2 is schematically a flowchart of a test method for a control chip according to an embodiment of the present disclosure.

FIG. 2 is schematically a flowchart of a test method for a control chip according to an embodiment of the present disclosure. In this embodiment of the present disclosure, the control chip may include a built-in self-test (BIST) circuit. The test method may be performed by the BIST circuit. As shown in FIG. 2, the method provided in this embodiment of the present disclosure may include the following steps.

In step S210, first test vectors stored in a first target memory chip are read.

In this embodiment of the present disclosure, before the BIST circuit tests the control chip, the method may further include: receiving a test instruction sent by ATE; and testing a function of the BIST circuit in response to the test instruction.

Specifically, the ATE may send a test instruction to the BIST circuit. The BIST circuit may test, according to the test instruction, whether the functions of the BIST circuit can be correctly implemented, to provide a basis for subsequently using the BIST circuit to test the control chip, so that the accuracy of the test can be increased. In other embodiments, the test instruction is not limited to being sent by the ATE, and may be alternatively sent by any other electronic device. For example, a computer may generate a test instruction and send the test instruction to the BIST circuit. This is not limited in the present disclosure.

In this embodiment of the present disclosure, before the BIST circuit tests the control chip, the method may further include: receiving an initialization instruction sent by ATE; and initializing the BIST circuit in response to the initialization instruction.

Specifically, the BIST circuit may include a BIST Config circuit. The ATE may send a configured initialization instruction to the BIST Config circuit, to initialize the BIST circuit. For example, an operating frequency of the BIST circuit for testing the control chip may be configured, so that a corresponding low-speed or high-speed test clock signal can be generated. In another example, an operating mode or the like of the BIST circuit may be configured.

In this embodiment of the present disclosure, the BIST circuit reads the first test vectors from the first target memory chip. The first test vectors herein are some or all of test vectors used for testing the control chip, and are stored in the first target memory chip in advance.

In an exemplary embodiment, before step S210, the method may further include: receiving a second control instruction sent by ATE; and storing, in response to the second control instruction, at least some of test vectors used for testing the control chip as the first test vectors in the first target memory chip.

In this embodiment of the present disclosure, the ATE or the computer may first use a test vector generation algorithm to generate test vectors used for testing the control chip, and the computer may then send the test vectors to the ATE, or the ATE directly generates test vectors and then sends some or all of the test vectors to the first target memory chip for storage. However, the present disclosure is not limited thereto. In other embodiments, the BIST circuit may include a test vector generation circuit. After receiving a second control instruction that is from the ATE and is used for triggering the control chip to start the test, the test vector generation circuit in the BIST circuit may be used to generate test vectors used for testing the control chip. The BIST circuit then sends some or all of the generated test vectors as the first test vectors to the first target memory chip for storage.

In an exemplary embodiment, before step S210, the method may further include: receiving a third control instruction sent by ATE; and testing the first target memory chip in response to the third control instruction; and repairing the first target memory chip if the first target memory chip fails the test.

In this embodiment of the present disclosure, before the first test vectors are stored in the first target memory chip, it needs to be ensured that the first target memory chip can implement a correct storage function. Therefore, before this, the ATE may be first used to test the first target memory chip. When the first target memory chip passes the test, it indicates that the first target memory chip is intact, and in this case, the first test vectors may be stored in the first target memory chip. When the first target memory chip fails the test, for example, the ATE inputs known character strings formed by "0s" and/or "1s" and stores the character strings in storing units corresponding to various addresses in the first target memory chip; after a particular delay, these character strings are then read from the storing units corresponding to the various addresses, and XOR operations are sequentially performed on the previously inputted character strings and subsequently read character strings, so that a faulty storage unit can be specifically determined. In this case, an address of the faulty storage unit can be recorded, and the reason of the error may be further analyzed so that the faulty storing unit can be repaired. After the repair, the first target memory chip may be tested again, and the process stops until the first target memory chip passes the test and is then used for storing the first test vectors.

It needs to be noted that a manner of testing the first target memory chip is not limited to the foregoing exemplary manner, and the first target memory chip may be tested in any other manner. In addition, the present disclosure is also not limited to using ATE to test the first target memory chip. For example, the BIST circuit may be used to test the first target memory chip. Alternatively, the ATE and the BIST circuit may be used together to test the first target memory chip. Alternatively, another electronic device having a test function may be used to test the first target memory chip.

In an exemplary embodiment, before step S210, the method may further include: acquiring a current status of a memory chip in a storage device; and using the memory chip in an idle state as the first target memory chip if the current status of the memory chip is the idle state, to store at least some of test vectors used for testing the control chip as the first test vectors in the first target memory chip.

Specifically, if a plurality of memory chips pass the test and can be normally used at the same time, statuses of various memory chips may be saved. For example, current statuses of the various memory chips may be recorded in a Config circuit of the BIST circuit. For example, if a memory chip has stored data (the data herein may be any data, may be test vectors used for testing the control chip, or may be other data), the status of the memory chip is labeled with "1", indicating that the memory chip is in an occupied state. In this case, the test vectors used for testing the control chip are not stored in the memory chip. In contrast, if a memory chip currently has not stored any data, the status of the memory chip is labeled with "0". In this case, the memory chip may be used as the first target memory chip to store some or all of the test vectors used for testing the control chip.

In this embodiment of the present disclosure, the first test vector may be any one or more of a scan test vector, a function test vector, and the like, a corresponding test vector may be generated according to a control logic that needs to be implemented and a circuit structure of the control chip, and the type and the number of the test vectors are not limited in the present disclosure.

In this embodiment of the present disclosure, the first target memory chip may be a read-write memory chip of any type, for example, a DRAM, a static random-access memory (SRAM), a Not AND (NAND, a flash memory device), or a Not OR (NOR, also a flash memory device). The first target memory chip may be a memory chip or some memory chips or all memory chips in a storage device, or may be a plurality of memory chips disposed in a plurality of different storage devices. These different storage devices may be of the same storage type or different storage types. For example, the storage devices may all be DRAMs or may all be static dynamic random-access memories (SDRAMs). Alternatively, among the storage devices, some are DRAMs, some are SDRAMs, or some are nonvolatile memories such as NANDs and/or NORs. This is not limited in the present disclosure.

In an exemplary embodiment, the first target memory chip may include a plurality of memory chips, the plurality of memory chips belong to the same storage device, and at the same time the control chip and the plurality of memory chips also belong to the same storage device. In some embodiments, a plurality of memory chips of the first target memory chip may be vertically stacked in sequence on the control chip. In some other embodiments, the plurality of memory chips of the first target memory chip may be vertically stacked in sequence under the control chip. In other embodiments, a plurality of memory chips of the first target memory chip may be vertically stacked in sequence. The plurality of memory chips vertically stacked in sequence may be horizontally interconnected to the control chip. In still some embodiments, the plurality of memory chips of the first target memory chip and the control chip may be horizontally distributed on the storage device. This is not limited in the present disclosure.

In step S220, the first test vectors are sent to the control chip.

In this embodiment of the present disclosure, the BIST circuit sends the first test vectors read from the first target memory chip to the control chip. For example, the BIST circuit may include a timing generation circuit, configured to generate a test clock signal, and sequentially send the first test vectors to the control chip based on the test clock signal.

In step S230, first output information returned by the control chip in response to the first test vectors is received.

In this embodiment of the present disclosure, after receiving the first test vectors sent by the BIST circuit, the control chip processes the first test vectors to generate corresponding first output information, and then returns the first output information to the BIST circuit.

In step S240, a first test result of the control chip is acquired based on the first output information and the first test vectors corresponding to the first output information.

In this embodiment of the present disclosure, after acquiring the first output information returned by the control chip, the BIST circuit compares the first output information with the first test vectors or reference data corresponding to the first test vectors, to acquire a first test result of the control chip. For example, it is assumed that the test of an AND gate including two input terminals and one output terminal in the control chip is used as an example. Inputted first test vectors are sequentially "11", "01", "10", and "00". Corresponding reference data is sequentially "1", "0", "0", and "0". If the first output information is also "1", "0", "0", and "0", it indicates that the AND gate in the control chip passes the test, or otherwise, it indicates that the AND gate in the control chip fails the test. Certainly, an actual test case may be much more complex than this case. This case is only used as example for description herein.

For the test method for a control chip provided in the embodiments of the present disclosure, in one aspect, a BIST circuit in the control chip is used to implement the test of the control chip, so that the degree of dependence on ATE can be reduced, and test costs are reduced. In another aspect, a first target memory chip other than the ATE can further be used for storing first test vectors used for testing the control chip, so that a storage space for test vectors can be enlarged, and a large number of test vectors used for testing the control chip can be all loaded once. In this way, during the test of the control chip, the test speed of the control chip can be increased, the test efficiency can be increased, and the test costs can be reduced.

An example in which a storage device is a DRAM is used below to describe the method provided in the foregoing embodiments.

Figure 3:
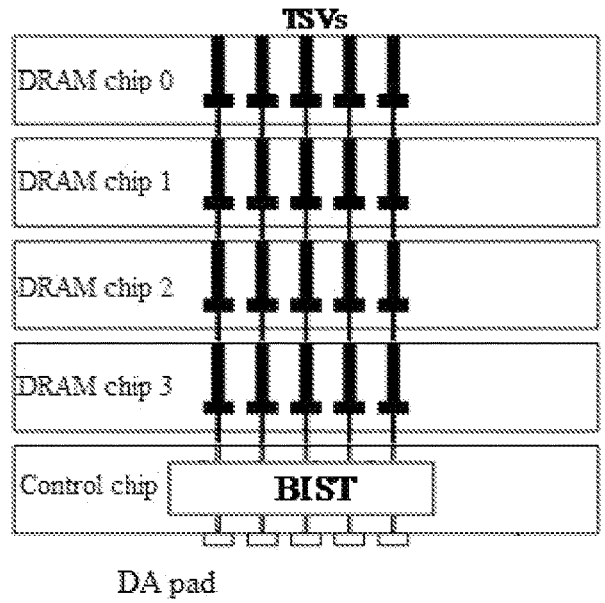
FIG. 3 is schematically a schematic diagram of a test method for a control chip according to an embodiment of the present disclosure.

FIG. 3 is schematically a schematic diagram of a test method for a control chip according to an embodiment of the present disclosure. In the embodiment in FIG. 3, it is assumed that a control chip and a first target memory chip belong to the same storage device and the first target memory chip includes DRAM chips 0 to 3. It needs to be noted that the number of the first target memory chips is not limited in the present disclosure. The four DRAM chips herein are only used as an example for description.

Continuing to refer to FIG. 3, the DRAM chips 0 to 3 in the first target memory chip are vertically stacked in sequence on the control chip, and adjacent DRAM chips are electrically connected by a TSV. A stacked storage device vertically stacks several DRAM chips together. Compared with a conventional storage device, the stacked storage device is highly advantageous in links, bandwidths, and latency, so that not only the space is saved, but also shorter chip spacings can be implemented, to further shorten a signal transmission path and reduce signal transmission latency. In the stacked storage device, a TSV technology may be used to perform a drilling process at an edge or a specific position of the DRAM chip, so that these holes are used as channels for wiring and vertical interconnection is completed.

The control chip in the embodiment in FIG. 3 may include a graphics processing unit (GPU), a central processing unit (CPU), a System on Chip (Soc), and/or the like, and may be used for controlling the functions of DRAM chips on the control chip.

In the embodiment in FIG. 3, the implementing the test of the control chip may include the following steps.

In the first step, ATE tests the DRAM chips 0 to 3. If a problem is found in the test, a faulty storing unit is repaired, to ensure that the DRAM chips 0 to 3 can operate normally.

In the second step, the ATE tests whether a function of a BIST circuit in the control chip is correct, to ensure that the BIST circuit can run normally.

The execution order of the first step and the second step may be interchanged, or the first step and the second step may be performed in parallel.

In the third step, the ATE writes some or all of test vectors used for testing the control chip as first test vectors into the DRAM chips 0 to 3.

In the fourth step, the ATE initializes the BIST circuit by using a BIST Config circuit, including setting a speed (low speed/high speed test clock), setting an operating mode, and the like.

The execution order of the third step and the fourth step may be interchanged, or the first step and the second step may be performed in parallel.

In the fifth step, the BIST circuit reads the first test vectors from the DRAM chips 0 to 3, and tests a control logic of the control chip.

In the sixth step, the ATE may determine, by reading current statuses (it is assumed that the storage device further includes DRAM chips other than the DRAM chips 0 to 3) of the DRAM chips in the BIST Config circuit, whether to write at the same time the remaining test vectors used for testing the control chip into an idle DRAM chip. In this way, while reading test vectors stored in the DRAM chips 0 to 3, the test vectors can be written into other idle DRAM chips, to further increase the test speed.

In the seventh step, the fifth step and the sixth step are repeated, until the test of the control chip is completed.

In the eighth step, after the test of the control chip is completed, all test results of the control chip can be acquired. Test results (including a first test result) generated in a test process of the control chip can be alternatively first temporarily stored in the DRAM chip. The DRAM chip used for storing test results herein may be any DRAM chip that is in an idle state and can operate normally after the test. After the whole test of the control chip is completed, the ATE can then read the test results stored in the DRAM chip, and the ATE performs analysis to acquire repair information of the control chip, and repairs a problem part in the control chip based on the repair information. Alternatively, the BIST circuit may be used to analyze test results to acquire repair information, and the BIST circuit repairs the control chip. This is not limited in the present disclosure.

For the test method for a control chip provided in the embodiments of the present disclosure, DRAM chips located in the same stack can be used for storing test vectors used for testing the control chip. In one aspect, a storage space for test vectors can be enlarged, to help to implement the loading of all test vectors once, so that the test efficiency can be increased, and it is not necessary to load test vectors and perform tests at different times, so that test costs are reduced. In another aspect, the control chip and the DRAM chips belong to the same storage device, a structural form of a vertical stack is used, and a TSV signal interconnection manner or the like may be used, so that test vectors can be read relatively rapidly from the DRAM chips, to further increase the test speed. In addition, a BIST circuit in the control chip is used to implement the test of the control chip, so that the degree of dependence on ATE can be reduced, and only a small number of DA pads are needed to implement indirect test of the control chip by ATE without being limited by the number of peripheral pins of a storage device.

Figure 4:
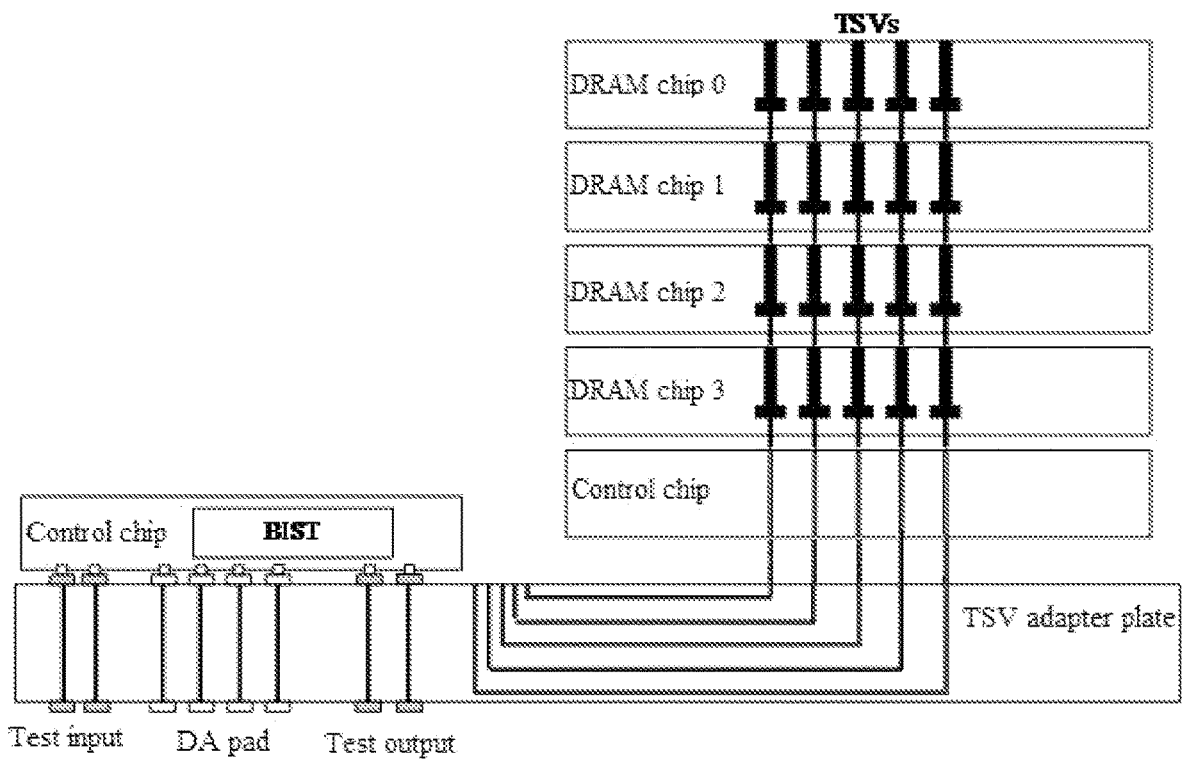
FIG. 4 is schematically a schematic diagram of a test method for a control chip according to an embodiment of the present disclosure.

A difference between the embodiment in FIG. 4 and the embodiment in FIG. 3 lies in that in the embodiment in FIG. 4, the control chip and the BIST circuit in the control chip are horizontally interconnected, by a TSV adapter plate, to vertically stacked DRAM chips 0 to 3. A process of implementing the test of the control chip by the BIST circuit in the control chip is described in the foregoing embodiments.

Figure 5:
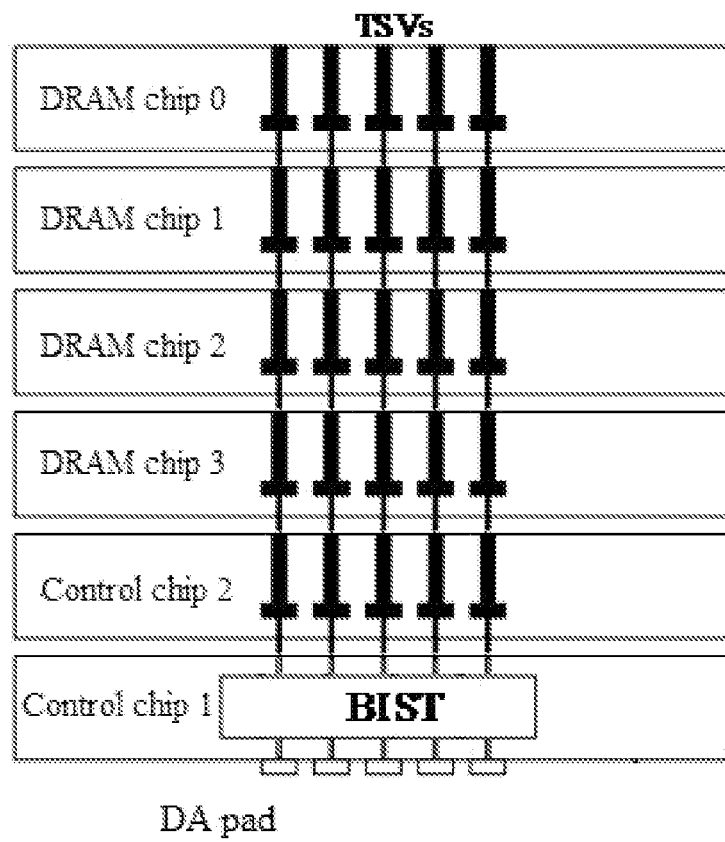
FIG. 5 is schematically a schematic diagram of a test method for a control chip according to an embodiment of the present disclosure.

FIG. 5 is schematically a schematic diagram of a test method for a control chip according to an embodiment of the present disclosure.

In the storage device in a stack form shown in FIG. 3, although the vertical stack allows denser memory chips in the same space, it also becomes more difficult for the control chip to manage the memory chips. Therefore, in the embodiment in FIG. 5, in addition to the original one-level control mechanism, one level of control mechanism is newly introduced. A base/logic die (a control chip 2 shown in FIG. 5) is disposed at the lowermost layer of a TSV memory chip, and DRAM chips that can manage all stacks are integrated on the base/logic die. The control chip 2 directly communicates with a control chip 1 (which may include a GPU/CPU/Soc, or the like), and may be used to collect data in the stacked DRAM chips, and assist the control chip 1 in managing the DRAM chips. In a stack system, the scale of the control chip 1 even has no significant change. The control chip 1 only needs to be oriented to these chips in the control chip 2. The management of the DRAM chips in different layers in each stack is completed by the control chip 2.

In the embodiment in FIG. 5, a BIST circuit may be disposed in the control chip 1. The BIST circuit may be used to implement the test of the control chip 1 or the control chip 2. For a test manner of the control chip 1 or the control chip 2, reference may be made to other embodiments. That is, first test vectors are read from a first target memory chip (for example, the DRAM chips 0 to 3).

Figure 6:
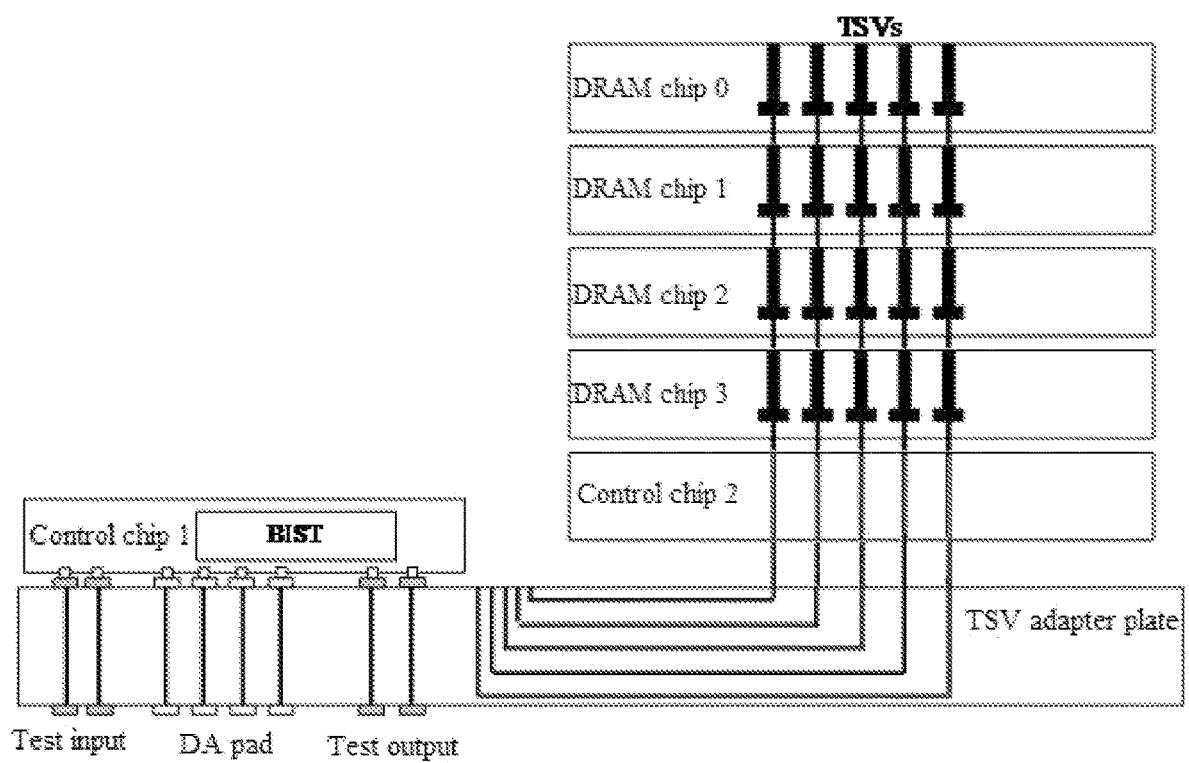
FIG. 6 is schematically a schematic diagram of a test method for a control chip according to an embodiment of the present disclosure.

A difference between the embodiment in FIG. 6 and the embodiment in FIG. 5 lies in that in the embodiment in FIG. 6, the control chip 1 and the BIST circuit in the control chip 1 are horizontally interconnected, by a TSV adapter plate, to the control chip 2 and the DRAM chips 0 to 3 that are vertically stacked. A process of implementing the test of the control chip 1 and the control chip 2 by the BIST circuit in the control chip 1 is described in the foregoing embodiments.

Figure 7:
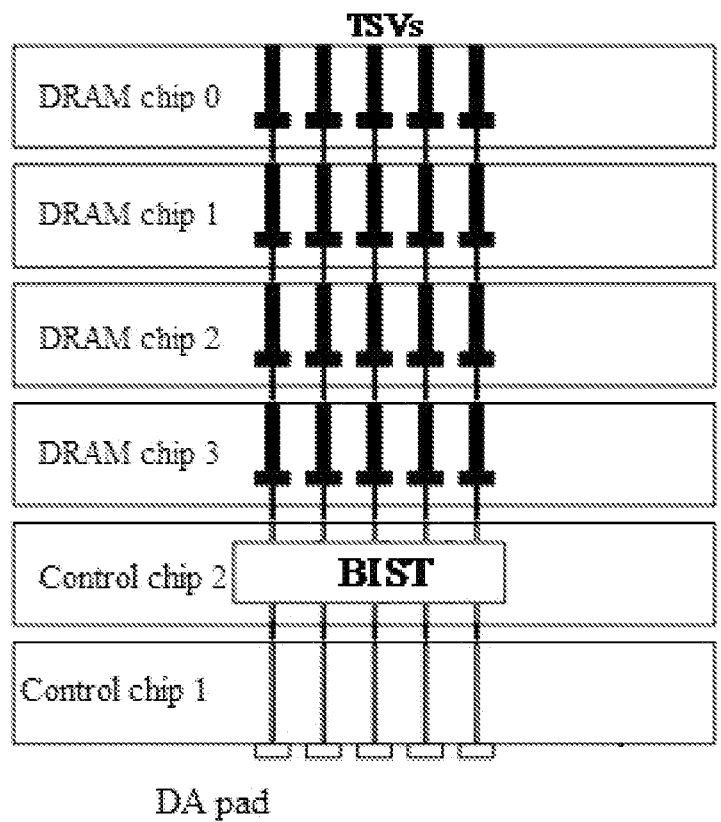
FIG. 7 is schematically a schematic diagram of a test method for a control chip according to an embodiment of the present disclosure.

FIG. 7 is schematically a schematic diagram of a test method for a control chip according to an embodiment of the present disclosure.

A difference between the embodiment in FIG. 7 and the embodiment in FIG. 5 lies in that the BIST circuit in the embodiment in FIG. 7 may be disposed in the control chip 2. The BIST circuit may implement the test of the control chip 1 or the control chip 2. For a test manner of the control chip 1 or the control chip 2, reference may be made to other embodiments. That is, first test vectors are read from a first target memory chip (for example, the DRAM chips 0 to 3).

Figure 8:
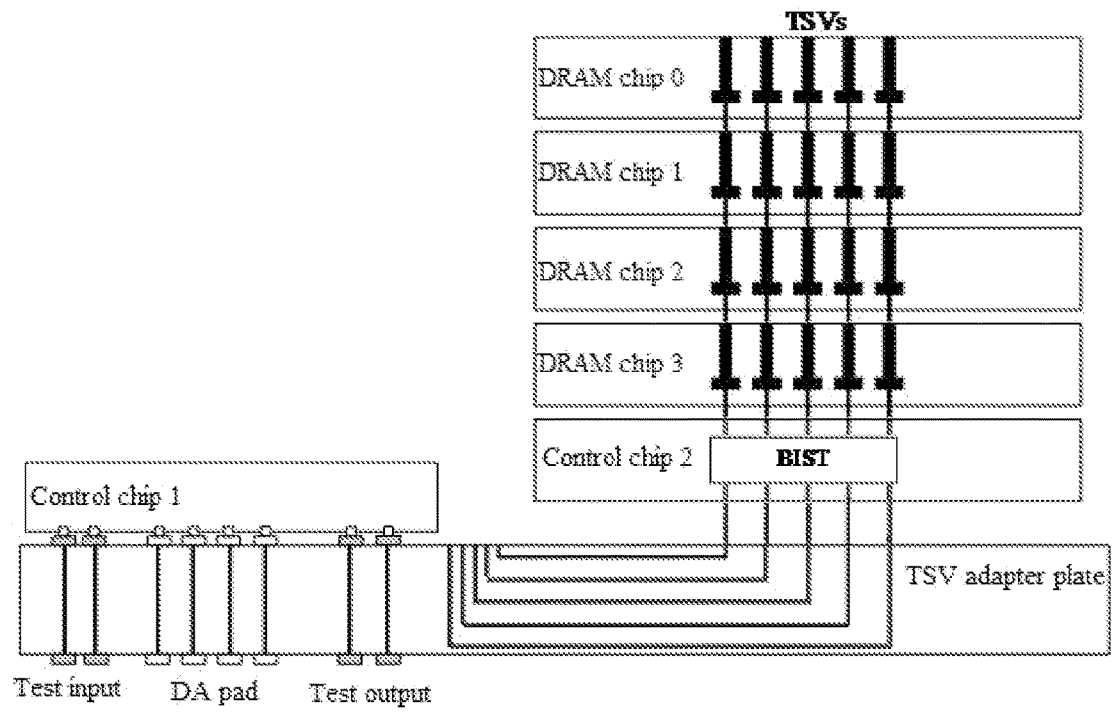
FIG. 8 is schematically a schematic diagram of a test method for a control chip according to an embodiment of the present disclosure.

A difference between the embodiment in FIG. 8 and the embodiment in FIG. 7 lies in that in the embodiment in FIG. 8, the control chip 1 is horizontally interconnected, by a TSV adapter plate, to the control chip 2, the BIST circuit in the control chip 2, and the DRAM chips 0 to 3 that are vertically stacked. A process of implementing the test of the control chip 1 and the control chip 2 by the BIST circuit in the control chip 1 is described in the foregoing embodiments.

Figure 9:
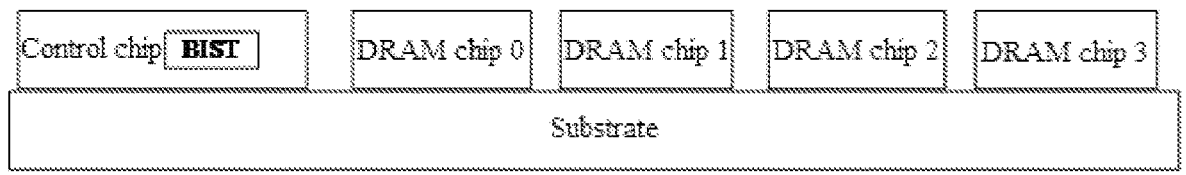
FIG. 9 is schematically a schematic diagram of a test method for a control chip according to an embodiment of the present disclosure.

FIG. 9 is schematically a schematic diagram of a test method for a control chip according to an embodiment of the present disclosure.

In the embodiment in FIG. 9, various DRAM chips, for example, DRAM chips 0 to 3 and a control chip may all be horizontally distributed on a substrate of a storage device. The BIST circuit may also implement the test of the control chip, and for a test manner of the control chip, reference may be made to other embodiments. That is, first test vectors are read from a first target memory chip (for example, the DRAM chips 0 to 3).

Figure 10:
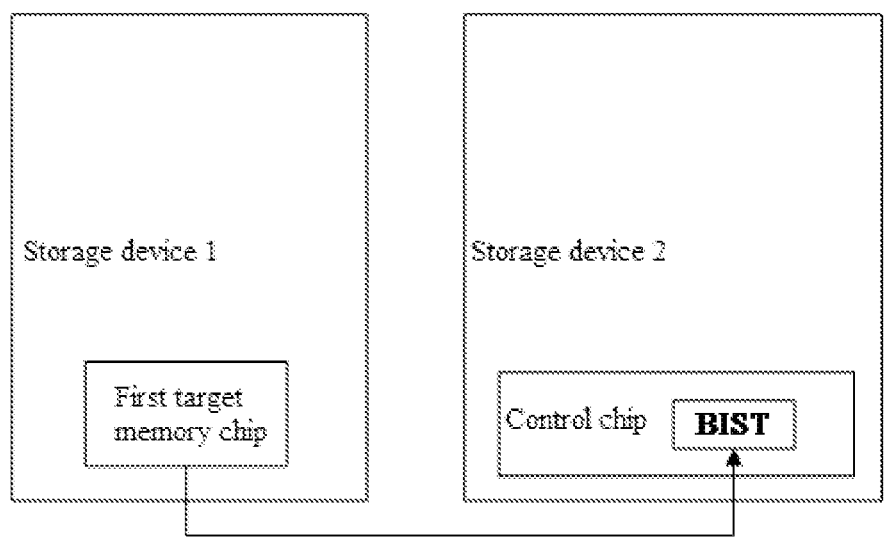
FIG. 10 is schematically a schematic diagram of a test method for a control chip according to an embodiment of the present disclosure.

FIG. 10 is schematically a schematic diagram of a test method for a control chip according to an embodiment of the present disclosure.

In all the foregoing embodiments, it is assumed that the first target memory chip and the control chip belong to the same storage device. In the embodiment in FIG. 10, the first target memory chip and the control chip may belong to different storage devices. For example, it is assumed herein that the first target memory chip belongs to a storage device 1, and the control chip belongs to a storage device 2. When the BIST circuit in the control chip needs to implement the test of the control chip in the storage device 2, first test vectors may be read from the first target memory chip in the storage device 1 for test.

The ATE or the BIST circuit in the storage device 2 may be used in advance to test various memory chips in the storage device 1, and an idle memory chip in the storage device 1 is then used as the first target memory chip to store the first test vectors.

In the embodiment in FIG. 10, the storage device 1 may also include a control chip. The BIST circuit may also be disposed in the control chip in the storage device 1, and the BIST circuit in the control chip in the storage device 1 may also implement the test of the control chip in the storage device 1.

In some other embodiments, the storage device 1 may also include a control chip. No BIST circuit may be provided in the control chip in the storage device 1. In this case, the BIST circuit in the storage device 2 may also be reused to implement the test of the control chip in the storage device 1 in parallel, so that the test efficiency of the control chips in the storage device 1 and the storage device 2 can be increased, a circuit occupation volume of the storage device 1 can be reduced, and the reuse of the BIST circuit can be implemented.

It needs to be noted that although FIG. 10 only shows one storage device 1. However, in practice, the storage device 1 may alternatively include a plurality of storage devices. The first target memory chip includes a plurality of memory chips. The plurality of memory chips may be distributed in the plurality of storage devices. In this case, some of the plurality of storage devices may include a BIST circuit, and some of the plurality of storage devices may not include a BIST circuit. Alternatively, none of the plurality of storage devices includes a BIST circuit. A storage device 1 that does not include a BIST circuit may reuse the BIST circuit in the storage device 2 including the BIST circuit to implement the test of the control chip of the storage device 1.

Figure 11:
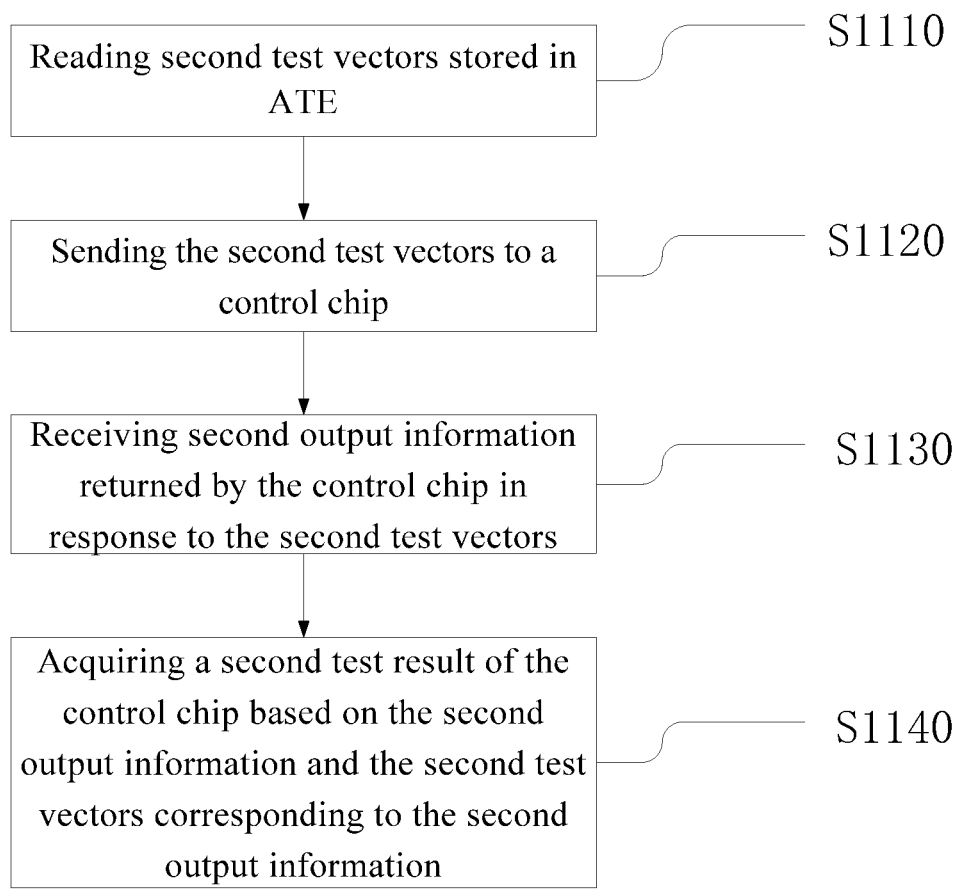
FIG. 11 is schematically a flowchart of a test method for a control chip according to an embodiment of the present disclosure.

FIG. 11 is schematically a flowchart of a test method for a control chip according to an embodiment of the present disclosure.

As shown in FIG. 11, a difference from the foregoing embodiments lies in that this embodiment of the present disclosure may further include the following steps.

In step S1110, second test vectors stored in ATE are read.

In this embodiment of the present disclosure, some test vectors may be stored in a first target memory chip, or some other test vectors may be stored in an internal memory space of the ATE are referred to as the second test vectors herein. In this way, a vector storage space may further be enlarged.

In step S1120, the second test vectors are sent to the control chip.

In this embodiment of the present disclosure, during the test of the control chip, the BIST circuit may read the stored second test vectors from the internal memory space of the ATE, and then send the second test vectors to the control chip.

In step S1130, second output information returned by the control chip in response to the second test vectors is received.

Similarly, after receiving the second test vectors, the control chip processes the second test vectors to generate second output information and return the second output information to the BIST circuit.

In step S1140, a second test result of the control chip is acquired based on the second output information and the second test vectors corresponding to the second output information.

In this embodiment of the present disclosure, the BIST circuit compares the second output information with the second test vectors or reference data corresponding to the second test vectors, that is, the BIST circuit may acquire a second test result of the control chip. A first test result and the second test result are both constituent parts of the test result of the control chip.

Figure 12:
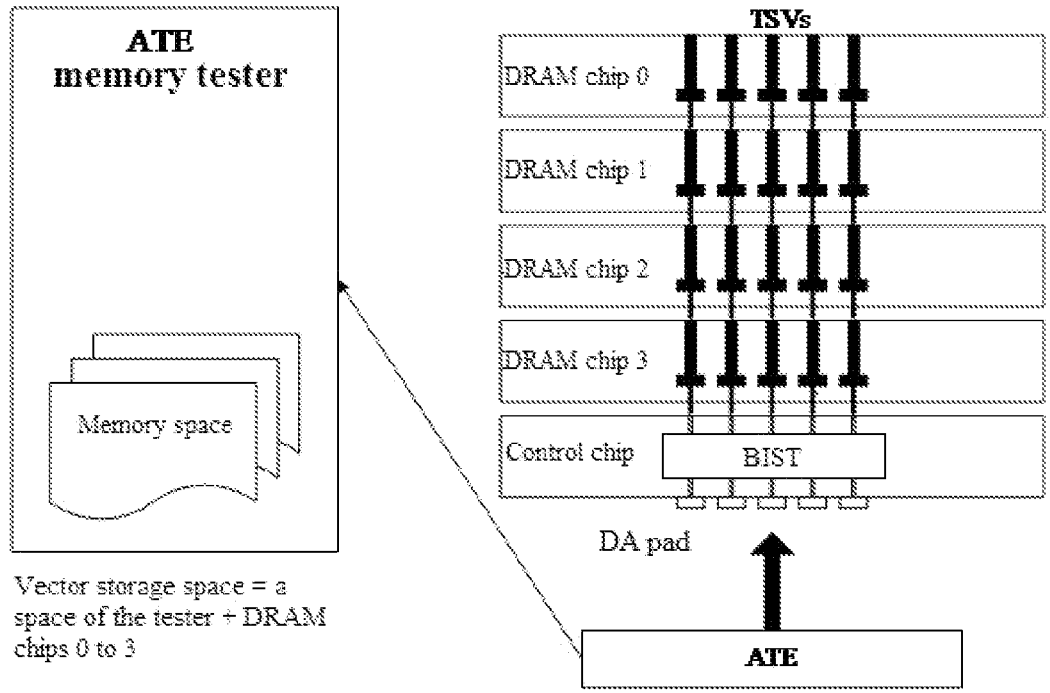
FIG. 12 is schematically a schematic diagram of a test method for a control chip according to an embodiment of the present disclosure.

For example, as shown in FIG. 12, a memory space of an ATE tester and DRAM chips 0 to 3 may all be used as a storage space for test vectors used for testing the control chip. When testing the control chip, the BIST circuit may read first test vectors from the DRAM chips 0 to 3 and may read the second test vectors from the ATE tester. That is, in the embodiment in FIG. 12, a vector storage space=the space of the tester+the DRAM chips 0 to 3. The vector storage space herein is a storage space used for storing test vectors. The space of the tester is the internal memory space of the ATE. That is, the test vectors used for testing the control chip may be stored in both the internal memory space of the ATE and the DRAM chips 0 to 3. However, this is not limited in the present disclosure. In other embodiments, all test vectors may be stored in the DRAM chips 0 to 3, or all test vectors may be stored in any one or two of the DRAM chips 0 to 3.

It may be understood that although the DRAM chips 0 to 3 in the embodiment in FIG. 12 uses a structural form of a vertical stack on the control chip. However, as can be known in combination with the foregoing embodiments, the present disclosure is not limited thereto. Any foregoing structural form may be used for the DRAM chips 0 to 3. The embodiment in FIG. 12 is only used for describing that both the first target memory chip and the ATE tester may be used for storing test vectors.

In an exemplary embodiment, the method may further include: sending the first test result of the control chip to a second target memory chip for storage.

In an exemplary embodiment, the method may further include: receiving a first control instruction sent by ATE; reading the first test result of the control chip from the second target memory chip in response to the first control instruction; and sending the first test result of the control chip to the ATE. That is, after the test of the control chip is completed, the ATE may read the first test result from the second target memory chip, and place the first test result in the ATE for analysis, to repair or replace the control chip. In this way, another memory chip is used for storing some or all test results, and in a test process, the storage of test vectors is not affected due to generation of a large number of test results, so that the test speed can be further increased.

In an exemplary embodiment, the control chip, the first target memory chip, and the second target memory chip may belong to the same storage device.

In an exemplary embodiment of the present disclosure, the first target memory chip and the second target memory chip may be vertically stacked in sequence on or under the control chip. Memory chips located in the same stack are used to implement the storage of test vectors and test results, so that data transmission paths between the BIST circuit and memory chips can be greatly shortened, thereby reducing latency of data transmission, to substantially increase the test efficiency.

Figure 13:
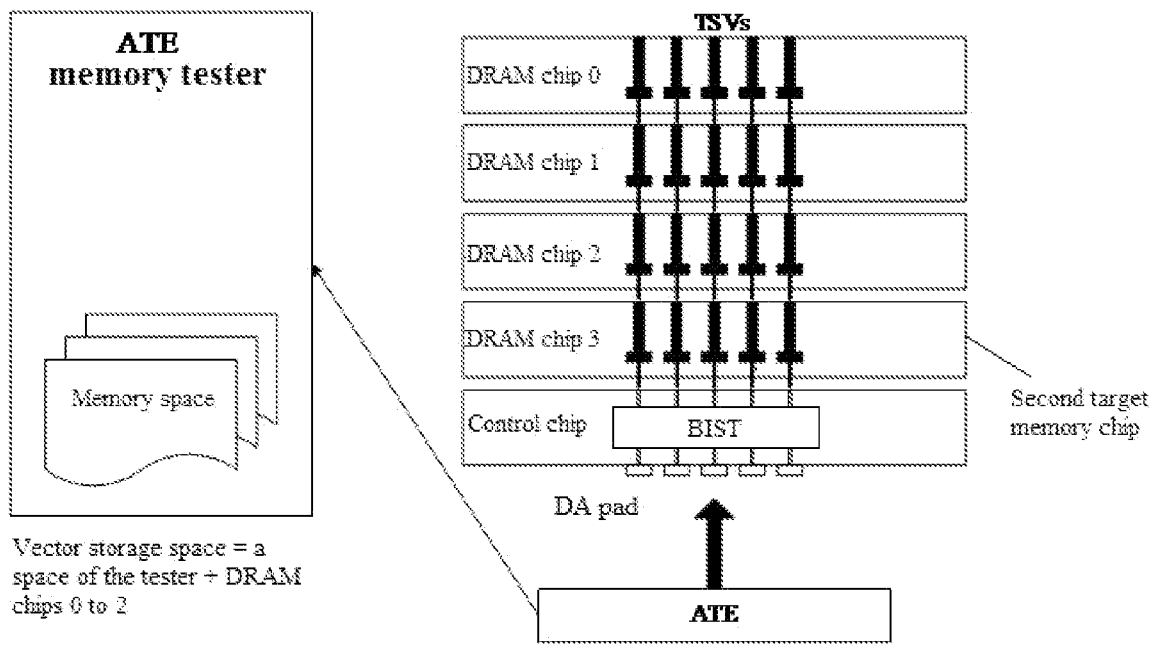
FIG. 13 is schematically a schematic diagram of a test method for a control chip according to an embodiment of the present disclosure.

For example, as shown in FIG. 13, it is assumed that the memory space in the ATE tester and the DRAM chips 0 to 2 are used as a storage space for test vectors, and the DRAM chip 3 is used as the second target memory chip to store test results of the control chip. For example, it is assumed that the BIST circuit sends the first test result and/or the second test result to the DRAM chip 3 for storage.

Similarly, although the DRAM chips 0 to 3 in the embodiment in FIG. 13 uses a structural form of a vertical stack on the control chip. However, as can be known in combination with the foregoing embodiments, the present disclosure is not limited thereto. Any foregoing structural form may be used for the DRAM chips 0 to 3. The embodiment in FIG. 13 is only used for describing that while some memory chips and the ATE tester are used for storing test vectors, some other memory chips may be used to store test results.

In an exemplary embodiment of the present disclosure, the method may further include: sending the first test result of the control chip to an automatic storage device for storage. A difference from the embodiment in FIG. 13 lies in that the BIST circuit may send the first test result to the ATE for storage. In this way, subsequently, it is not necessary to read the first test result from the second target memory chip.

It may be understood that a memory space of any idle ATE tester and the memory chips may be designated to store test vectors, or a memory space of any idle ATE tester and the memory chip may be designated to store test results. This is not limited to the foregoing exemplary description.

Figure 14:
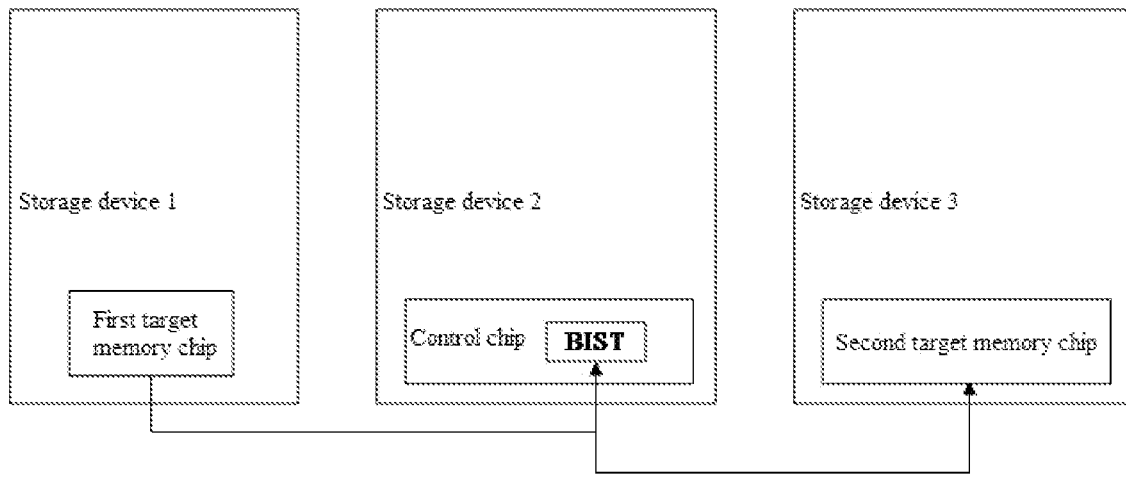
FIG. 14 is schematically a schematic diagram of a test method for a control chip according to an embodiment of the present disclosure.

FIG. 14 is schematically a schematic diagram of a test method for a control chip according to an embodiment of the present disclosure.

In the embodiment in FIG. 14, a first target memory chip, a control chip, and a second target memory chip respectively belong to different storage devices, for example, they respectively belong to a storage device 1, a storage device 2, and a storage device 3. When a BIST circuit in the control chip in the storage device 2 tests the control chip of the storage device 2, first test vectors may be read from the first target memory chip in the storage device 1. After acquiring a first test result, the BIST circuit in the control chip in the storage device 2 may send the first test result to the second target memory chip in the storage device 3 for storage. Memory chips that respectively belong to different storage devices are used for storing test vectors and test results, so that a vector storage space can be further enlarged.

It needs to be noted that the storage device 1 and the storage device 3 in the embodiment in FIG. 14 may respectively include a plurality of storage devices 1 and a plurality of storage devices 3. The first target memory chip and the second target memory chip may also respectively include a plurality of memory chips. The plurality of memory chips in the first target memory chip may be distributed in the plurality of storage devices 1, and the plurality of memory chips in the second target memory chip may be distributed in the plurality of storage devices 3.

Figure 15:
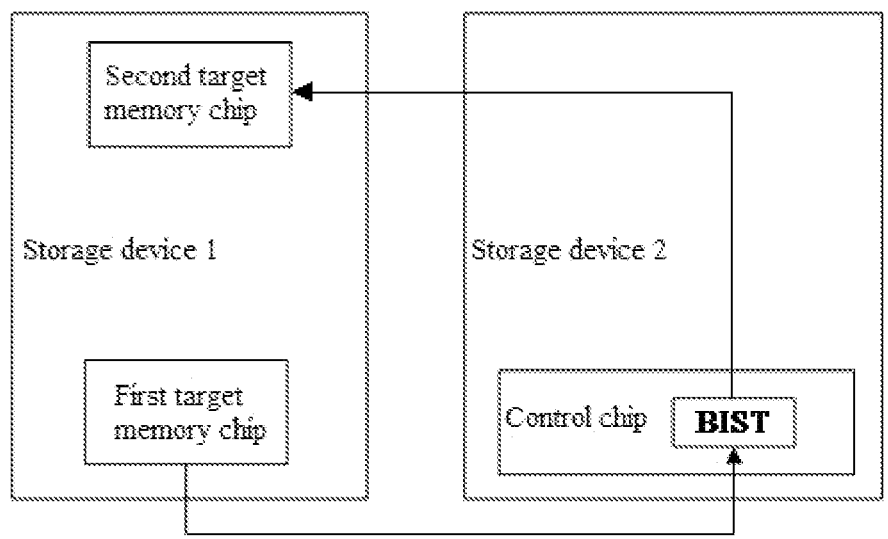
FIG. 15 is schematically a schematic diagram of a test method for a control chip according to an embodiment of the present disclosure.

FIG. 15 is schematically a schematic diagram of a test method for a control chip according to an embodiment of the present disclosure.

In the embodiment in FIG. 15, a first target memory chip and a second target memory chip may belong to the same storage device (for example, a storage device 1 in FIG. 15). A control chip and a BIST circuit disposed in the control chip may be located on another storage device (for example, the storage device 2 in FIG. 15).

In some other embodiments, the second target memory chip and the control chip may alternatively belong to the same storage device. The first target memory chip may be located on another storage device. In still some embodiments, the first target memory chip and the control chip may be located on the same storage device, and the second target memory chip is located on another storage device, and the like. The BIST circuit in the storage device 2 may also be reused to test the control chips in the storage device 1 and a storage device 3 in parallel.

It needs to be noted that the storage device 1 and the storage device 2 in the embodiment in FIG. 15 may respectively include a plurality of storage devices 1 and a plurality of storage devices 2. The first target memory chip and the second target memory chip may also respectively include a plurality of memory chips. The plurality of memory chips in the first target memory chip may be distributed in the plurality of storage devices 1, and the plurality of memory chips in the second target memory chip may be distributed in the plurality of storage devices 1.

For the test method for a control chip provided in the embodiments of the present disclosure, in one aspect, a memory chip that has passed a test is used to implement distributed storage of test vectors used for testing the control chip, thereby enlarging a vector storage space. In another aspect, a BIST technology is used to implement self-test of the control chip, so that test costs can be reduced, the time required for the test is shortened, the automation of a design for testing can be implemented, and a test algorithm is automatically implemented, thereby achieving the objectives of high test quality and low test costs. Next, a BIST circuit is close to the control chip under test to readily implement a full-speed test, so that more generated defects are covered and the test time is reduced. The method may further provide each storing unit with a self-diagnosis function and a self-repair function.

Figure 16:
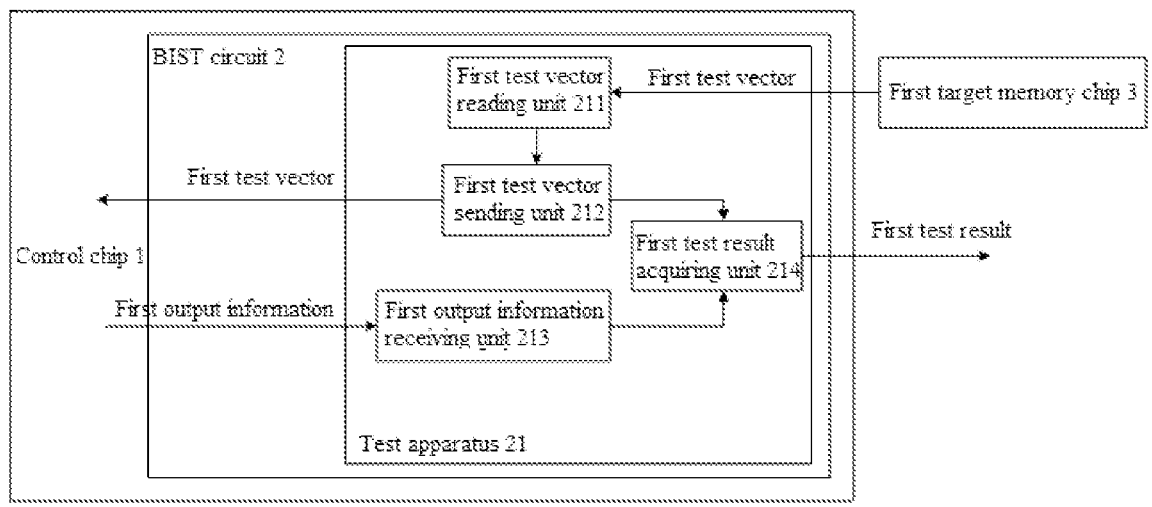
FIG. 16 is schematically a schematic diagram of a test apparatus for a control chip according to an embodiment of the present disclosure.

FIG. 16 is schematically a schematic diagram of a test apparatus for a control chip according to an embodiment of the present disclosure. As shown in FIG. 16, a control chip 1 may include a BIST circuit 2. The BIST circuit 2 may include a test apparatus 21. In this embodiment of the present disclosure, the test apparatus 21 may include a first test vector reading unit 211, a first test vector sending unit 212, a first output information receiving unit 213, and a first test result acquiring unit 214.

The first test vector reading unit 211 may be configured to read first test vectors stored in a first target memory chip 3. The first test vector sending unit 212 may be configured to send the first test vectors to the control chip 1. The first output information receiving unit 213 may be configured to receive first output information returned by the control chip 1 in response to the first test vectors. The first test result acquiring unit 214 may be configured to acquire a first test result of the control chip 1 based on the first output information and the first test vectors corresponding to the first output information.

In an exemplary embodiment, the test apparatus 21 may further include: a second test vectors reading unit, which may be configured to read second test vectors stored in ATE; a second test vectors sending unit, which may be configured to send the second test vectors to the control chip; a second output information receiving unit, which may be configured to receive second output information returned by the control chip in response to the second test vectors; and a second test result acquiring unit, which may be configured to acquire a second test result of the control chip based on the second output information and the second test vectors corresponding to the second output information.

In an exemplary embodiment, the test apparatus 21 may further include: a first test result storing unit, which may be configured to send the first test result of the control chip to a second target memory chip for storage.

In an exemplary embodiment, the control chip, the first target memory chip, and the second target memory chip may belong to the same storage device.

In an exemplary embodiment of the present disclosure, the first target memory chip and the second target memory chip may be vertically stacked in sequence on or under the control chip.

In an exemplary embodiment, the test apparatus 21 may further include: a first control instruction receiving unit, which may be configured to receive a first control instruction sent by ATE; a first test result reading unit, which may be configured to read the first test result of the control chip from the second target memory chip in response to the first control instruction; and a first test result dump unit, which may be configured to send the first test result of the control chip to the ATE.

In an exemplary embodiment of the present disclosure, the test apparatus 21 may further include: a first test result forwarding unit, which may be configured to send the first test result of the control chip to an automatic storage device for storage.

In an exemplary embodiment, the test apparatus 21 may further include: a second control instruction receiving unit, which may be configured to receive a second control instruction sent by ATE; and a first test vector storing unit, which may be configured to store, in response to the second control instruction, at least some of test vectors used for testing the control chip as the first test vectors in the first target memory chip.

In an exemplary embodiment, the test apparatus 21 may further include: a third control instruction receiving unit, which may be configured to receive a third control instruction sent by ATE; a first memory testing unit, which may be configured to test the first target memory chip in response to the third control instruction; and a first memory repairing unit, which may be configured to repair the first target memory chip if the first target memory chip fails the test.

In an exemplary embodiment, the test apparatus 21 may further include: a memory status acquiring unit, which may be configured to acquire a current status of a memory chip in a storage device; and a first memory determining unit, which may be configured to use the memory chip in an idle state as the first target memory chip if the current status of the memory chip is the idle state, to store at least some of test vectors used for testing the control chip as the first test vectors in the first target memory chip.

In an exemplary embodiment, the test apparatus 21 may further include: a test instruction receiving unit, which may be configured to receive a test instruction sent by ATE; and a self-test circuit testing unit, which may be configured to test a function of the BIST circuit in response to the test instruction.

In an exemplary embodiment, the test apparatus 21 may further include: an initialization instruction receiving unit, which may be configured to receive an initialization instruction sent by ATE; and a self-test circuit initialization unit, which may be configured to initialize the BIST circuit in response to the initialization instruction.

In an exemplary embodiment, the first target memory chip may include a plurality of memory chips, and the plurality of memory chips may be vertically stacked in sequence on or under the control chip.

In an exemplary embodiment, the first test vector may include any one of a scan test vector and a function test vector.

Further, an embodiment of the present disclosure further provides an electronic device. The electronic device may include: one or more processors; and a storage apparatus, configured to store one or more programs, where the one or more programs, when performed by the one or more processors, cause the one or more processors to implement the method in the foregoing embodiments.

Further, an embodiment of the present disclosure further provides a computer-readable storage medium, storing a computer program, where the program is executed by a processor to implement the method in the foregoing embodiments.

For other content, reference may be made to the foregoing method embodiments.

Other embodiments of the present disclosure will be easily conceived by those skilled in the art after taking the Description into consideration and practicing the solution disclosed herein. The present application is intended to cover any variations, uses, or adaptive changes of the present disclosure. These variations, uses, or adaptive changes follow the general principles of the present disclosure and include common general knowledge or conventional technical means in the art that are not disclosed herein. The Description and the embodiments are to be regarded as being exemplary only. The true scope and spirit of the present disclosure are subject to the appended claims.

What is claimed is:

1. A test method for a control chip, the control chip comprising a built-in self-test (BIST) circuit, and the test method being performed by the BIST circuit, wherein the test method comprises:
  acquiring a current status of a memory chip in a storage device;
  using the memory chip in an idle state as a first target memory chip when the current status of the memory chip is the idle state, to store at least some of test vectors used for testing the control chip as first test vectors in the first target memory chip, wherein the idle state is a status of the memory chip when the memory chip currently has not stored any data;

reading the first test vectors stored in the first target memory chip;

sending the first test vectors to the control chip;

receiving first output information returned by the control chip in response to the first test vectors; and acquiring a first test result of the control chip based on the first output information and the first test vectors corresponding to the first output information.

2. The test method for a control chip according to claim 1, further comprising:

reading second test vectors stored in automatic test equipment (ATE);

sending the second test vectors to the control chip;

receiving second output information returned by the control chip in response to the second test vectors; and acquiring a second test result of the control chip based on the second output information and the second test vectors corresponding to the second output information.

3. The test method for a control chip according to claim 1, further comprising:

sending the first test result of the control chip to a second target memory chip for storage.

4. The test method for a control chip according to claim 3, wherein the control chip, the first target memory chip, and the second target memory chip belong to a same storage device.

5. The test method for a control chip according to claim 4, wherein the first target memory chip and the second target memory chip are vertically stacked in sequence on or under the control chip.

6. The test method for a control chip according to claim 3, further comprising:

receiving a first control instruction sent by automatic test equipment (ATE);

reading the first test result of the control chip from the second target memory chip in response to the first control instruction; and sending the first test result of the control chip to the ATE.

7. The test method for a control chip according to claim 1, further comprising:

sending the first test result of the control chip to an automatic storage device for storage.

8. The test method for a control chip according to claim 1, further comprising:

receiving a second control instruction sent by automatic test equipment (ATE); and storing, in response to the second control instruction, the at least some of the test vectors used for testing the control chip as the first test vectors in the first target memory chip.

9. The test method for a control chip according to claim 1, further comprising:

receiving a third control instruction sent by automatic test equipment (ATE);

testing the first target memory chip in response to the third control instruction; and repairing the first target memory chip when the first target memory chip fails the test.

10. The test method for a control chip according to claim 1, further comprising:

receiving a test instruction sent by automatic test equipment (ATE); and testing a function of the BIST circuit in response to the test instruction.

11. The test method for a control chip according to claim 1, further comprising:

receiving an initialization instruction sent by automatic test equipment (ATE); and initializing the BIST circuit in response to the initialization instruction.

12. The test method for a control chip according to claim 1, wherein the first target memory chip comprises a plurality of memory chips, and the plurality of memory chips are vertically stacked in sequence on or under the control chip.

13. The test method for a control chip according to claim 1, wherein the first test vectors comprise any one of scan test vectors or function test vectors.

14. A test apparatus for a control chip, the control chip comprising a built-in self-test (BIST) circuit, and the BIST circuit comprising the test apparatus, wherein the test apparatus comprises:

a memory status acquiring circuit, configured to acquire a current status of a memory chip in a storage device;

a first memory determining circuit, configured to use the memory chip in an idle state as a first target memory chip when the current status of the memory chip is the idle state, to store at least some of test vectors used for testing the control chip as first test vectors in the first target memory chip, wherein the idle state is a status of the memory chip when the memory chip currently has not stored any data;

a first test vector reading circuit, configured to read the first test vectors stored in the first target memory chip;

a first test vector sending circuit, configured to send the first test vectors to the control chip;

a first output information receiving circuit, configured to receive first output information returned by the control chip in response to the first test vectors; and a first test result acquiring circuit, configured to acquire a first test result of the control chip based on the first output information and the first test vectors corresponding to the first output information.

15. An electronic device, comprising:

one or more processors; and a memory, configured to store one or more programs, wherein the one or more programs, when executed by the one or more processors, cause the one or more processors to implement the test method according to claim 1.

16. The test method for a control chip according to claim 8, wherein storing, in response to the second control instruction, the at least some of the test vectors used for testing the control chip as the first test vectors in the first target memory chip comprises:

generating, in response to the second control instruction, the test vectors used for testing the control chip; and storing the at least some of the test vectors used for testing the control chip as the first test vectors in the first target memory chip.

* * * * *